(12) United States Patent  
Noquil et al.

(10) Patent No.: US 7,154,186 B2
(45) Date of Patent: Dec. 26, 2006

(54) MULTI-FLIP CHIP ON LEAD FRAME ON OVER MOLDED IC PACKAGE AND METHOD OF ASSEMBLY

(75) Inventors: Jonathan A. Noquil, Lapu-Lapu (PH); Seung Yong Choi, Gyeonggi-do (KR); Rajeev Joshi, San Jose, CA (US); Chung-Lin Wu, San Jose, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/803,464

(22) Filed: Mar. 18, 2004

(65) Prior Publication Data

US 2005/0206010 A1  Sep. 22, 2005

(51) Int. Cl.
*H01L 23/48* (2006.01)

(52) U.S. Cl. .................. 257/778; 257/723; 257/676
(58) Field of Classification Search ............. 257/666, 257/673, 676, 723, 724, 778
See application file for complete search history.

(56) References Cited

U.S. PATENT DOCUMENTS

| 5,331,200 | A |   | 7/1994  | Teo et al. |         |
|-----------|---|---|---------|------------|---------|
| 5,780,926 | A | * | 7/1998  | Seo        | 257/676 |
| 6,084,292 | A |   | 7/2000  | Shinohara  |         |
| 6,133,634 | A |   | 10/2000 | Joshi      |         |
| 6,452,255 | B1|   | 9/2002  | Bayan et al.|        |
| 6,476,481 | B1| * | 11/2002 | Woodworth et al. | 257/696 |
| 6,483,180 | B1|   | 11/2002 | Bayan et al.|        |
| 6,509,582 | B1|   | 1/2003  | Bendall    |         |
| 6,525,405 | B1|   | 2/2003  | Chun et al.|         |
| 6,696,321 | B1|   | 2/2004  | Joshi      |         |
| 6,798,044 | B1| * | 9/2004  | Joshi      | 257/666 |
| 2001/0001069 | A1 | * | 5/2001 | Huang et al. | 438/121 |
| 2002/0066950 | A1 |   | 6/2002 | Joshi      |         |
| 2002/0113305 | A1 | * | 8/2002 | Huang      | 257/690 |
| 2003/0011005 | A1 |   | 1/2003 | Joshi      |         |
| 2003/0189248 | A1 | * | 10/2003| Estacio et al. | 257/737 |
| 2004/0212074 | A1 | * | 10/2004| Divakar et al. | 257/698 |

* cited by examiner

*Primary Examiner*—T. N. Quach
(74) *Attorney, Agent, or Firm*—Thomas R. FitzGerald, Esq.; Hiscock & Barclay, LLP

(57) ABSTRACT

A multichip module package uses bond wire with plastic resin on one side of a lead frame to package an integrated circuit and flip chip techniques to attach one or more mosfets to the other side of the lead frame. The assembled multichip module 30 has an integrated circuit controller 14 on a central die pad. Wire bonds 16 extend from contact areas on the integrated circuit to outer leads 2.6 of the lead frame 10. On the opposite, lower side of the central die pad, the sources and gates of the mosfets 24, 26 are bump or stud attached to the half etched regions of the lead frame. The drains 36 of the mosfets and the ball contacts 22.1 on the outer leads are soldered to a printed circuit board.

13 Claims, 9 Drawing Sheets

SHIPMENT

SAW/SINGULATE

TAPE & REEL

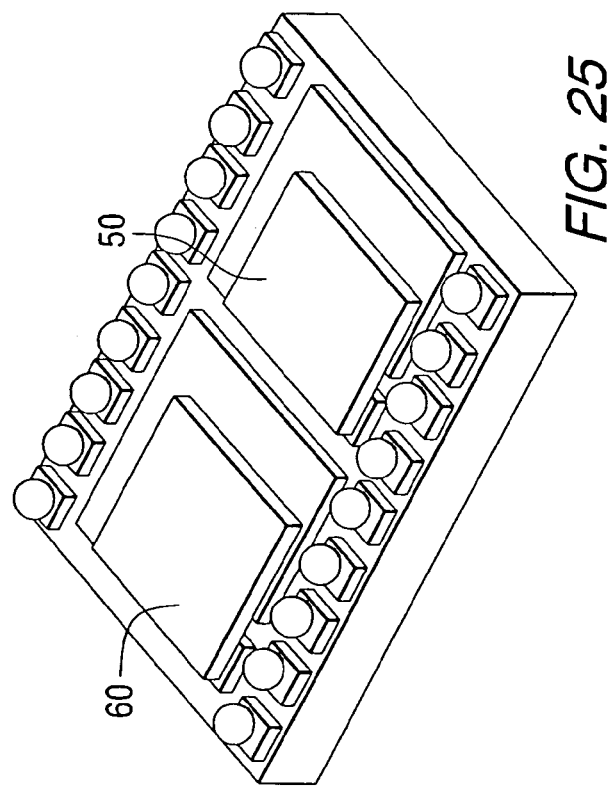
FIG. 25
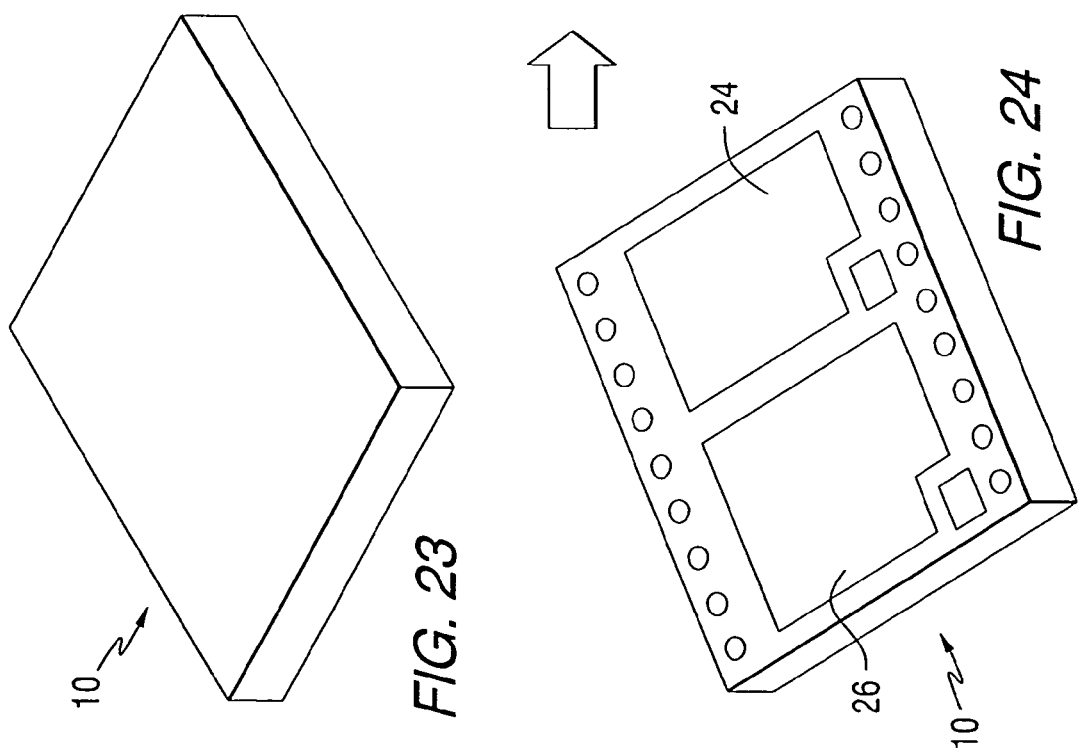
FIG. 23
FIG. 24

MULTI-FLIP CHIP ON LEAD FRAME ON OVER MOLDED IC PACKAGE AND METHOD OF ASSEMBLY

FIELD

This invention relates to semiconductor packaging and, in particular, to a multichip package with two or more mosfets and a mosfet controller integrated circuit.

BACKGROUND

Power mosfets are ubiquitous in modern electronic systems. They provide the power to motors and actuators in automobiles and to electronic displays including computer terminals and cell phones. There is a constant demand to make electronic systems perform more functions, take us less space and be more reliable. Customers of integrated circuit and mosfet manufacturers want an integrated solution in a single chip or single module that includes not only the power mosfets needed for the system, but also the controller integrated circuit for operating the mosfets. An ideal solution would be a single die that included the power mosfets and their controlling logic circuits. But such a solution has eluded manufacturers because it is difficult for a single die to handle the very different levels of voltage and current for logic and power devices. Logic and controller circuits typically operate in the range of several volts and milliamps, but power mosfets may operate over hundreds of volts and carrying ten of amps. Instead of a single chip solution, a popular compromise is a single package solution where logic and power dies are put into in a single package. That solution is referred to as a multichip module. The following references show examples of multichip modules.

U.S. Published Application 2002/0066950 shows and describes a flip chip multichip module that has two mosfets. The package shows a conventional lead frame where mosfets are bump attached to opposite side of the die pad and the leadframe is then encapsulated in plastic. The publication discloses an alternate embodiment where one die is an integrated circuit controller and the other is a mosfet.

U.S. Pat. No. 5,780,926 shows and describes a multichip package comprising multiple dies and a leadframe. The leadframe has insulating layers on its upper and lower sides and dies on opposite sides are mounted on the insulating layers. The insulating layers and the leadframe have conductive vias with terminals on opposite sides. The dies are wire bonded to the terminals so that the dies on one side are selectively connected to the dies on the other side.

U.S. Pat. No. 6,469,384 shows and describes a semiconductor package without a leads and without a molded body.

SUMMARY

The above solutions have several drawbacks. Some are complex and require special leadframes with conductive vias. Others package only two chips so that they cannot be used for applications that require multiple mosfets and a controller. However, many mosfet applications use high side and low side mosfets with a common controller. Other packages do not provide a molded encapsulant for the integrated circuit.

Signal integrity is a major design problem in complex systems that run at high speed and include logic and power devices. The interconnect technology responsible for maintaining signal integrity may have highly variable resistance due to varying thicknesses of the solder leads or conductive traces that interconnect the devices on a printed circuit board. If the lead or trace has too high a resistance, the system may fail or malfunction.

In order to overcome the drawbacks of the prior art and provide systems with improved signal integrity, we have invented a multichip package and packaging method that relies upon proven technology familiar to manufacturers. Our invention uses a standard package foot print that enables customers to readily incorporate multichip modules into their existing systems. Our invention achieves improved performance by closely locating the system die to each other to provide short interconnection length. The invention provides a high interconnect density and reduces the space needed on a printed circuit board for the circuits that populate the board. The invention also provides lower power consumption by requiring smaller drivers. It may be used for mixed signal applications, saves package costs and is faster to bring a given multichip module to market.

The invention provides a surface mounted multichip module package that houses an integrated circuit for controlling one or more power mosfets that are also included in the package. The package uses a leadframe having a die pad with upper and lower surfaces and a plurality of outer leads surrounding the die pad. The leadframe is prepared by half etching the lower, mosfet side to define source, gate and outer leads. The lower side of the half etched leadframe is then affixed to a tape so that the upper or integrated circuit side exposed. The integrated circuit is bonded to the die pad and its contact areas are wire bonded to outer lead on the leadframe. The upper side of the lead frame with the integrated circuit is encapsulated in plastic insulating resin. Mold compound fills the etched regions except the taped areas. The tape is removed after molding to expose the areas defined to receive the multiple flip chip mosfets. The preferred embodiment of the invention contemplates two mosfets, one for high side and one for low side power. The lower central surface of the leadframe is half etched to define source and gate contact pads. The latter is a step commonly used in flip chip packages. The mosfets are processed to have source and gate bumps (studs) for attaching to the pads on the lower side of the leadframe. Ball contacts are applied to the bottom of the outer leads to provide external contacts to the source, gate and integrated circuit. The backsides of the mosfets have their respective drain contacts that may be soldered to a printed circuit board.

The invention thus provides a package with leadless external contacts and comprising a plurality of contact balls extending from outer leads rails of the lead frame for establishing an electrical connection to the contact areas of the integrated circuit and to the sources and gates of the mosfets. The solder balls and the drain may be soldered to the surface of a printed circuit board.

DRAWINGS

FIG. 23 is a top perspective view of the over molded package.

FIG. 24 is a bottom perspective view of the over molded package before mosfets are attached.

FIG. 25 is a bottom perspective view of the over molded package after mosfets are attached.

DETAILED DESCRIPTION

A known method of forming a flip chip on leadframe semiconductor package employs a plated leadframe. A leadframe is a patterned sheet of metal, typically copper, that has been plated, usually with silver, nickel or palladium. Conventionally, a leadframe is plated to prevent the copper from oxidizing, and to provide a surface to which solder will adhere. The pattern of the sheet of metal provides a leadframe for forming a semiconductor package.

Figure 1:
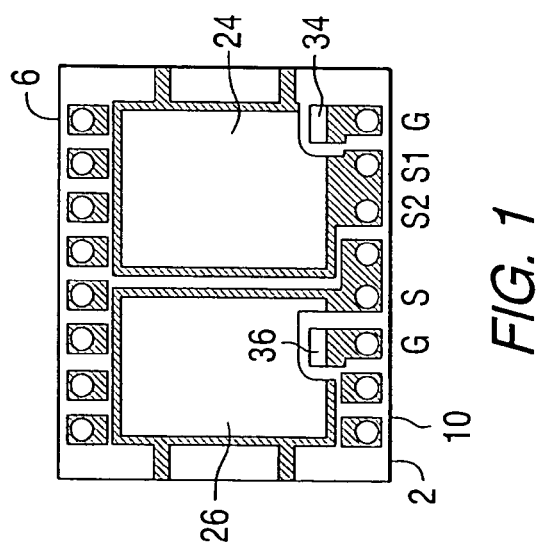
FIG. 1 is a plan view of the lower side surface of the leadframe with the half-etch portions shown in shaded areas.
Figure 5:
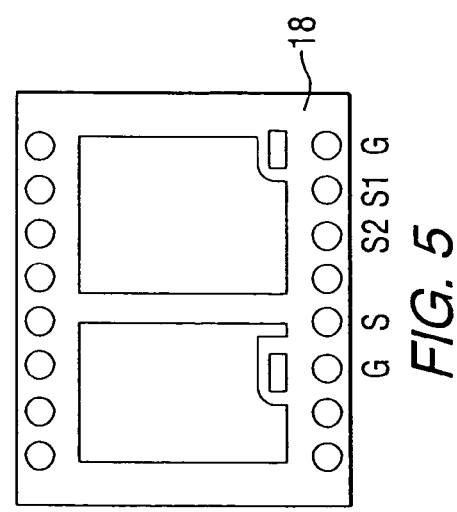
FIG. 5 shows the bottom surface of a molded leadframe.
Figure 7:
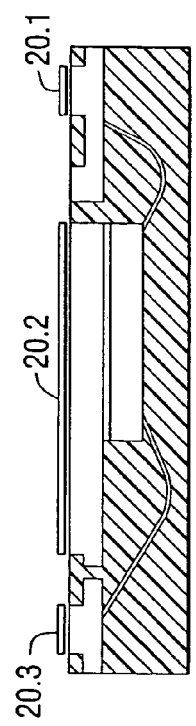
FIG. 7 shows screen print paste applied to the lower surface of the leadframe.
Figure 8:
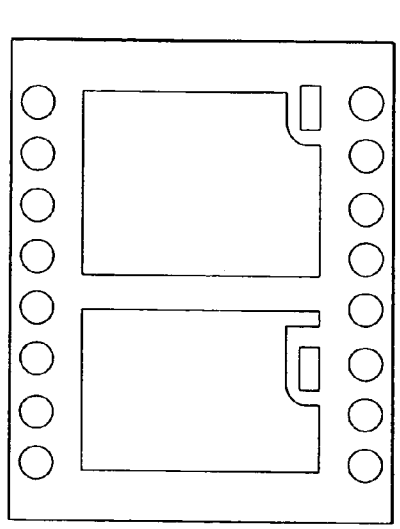
FIG. 8 is a bottom view the leadframe shown in FIG. 7.
Figure 9:
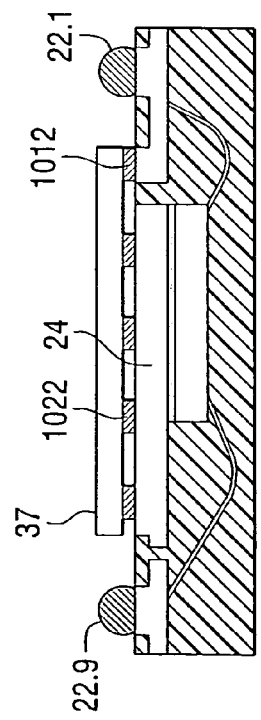
FIG. 9 shows the mosfets dies and contact balls attached to the leadframe.
Figure 10:
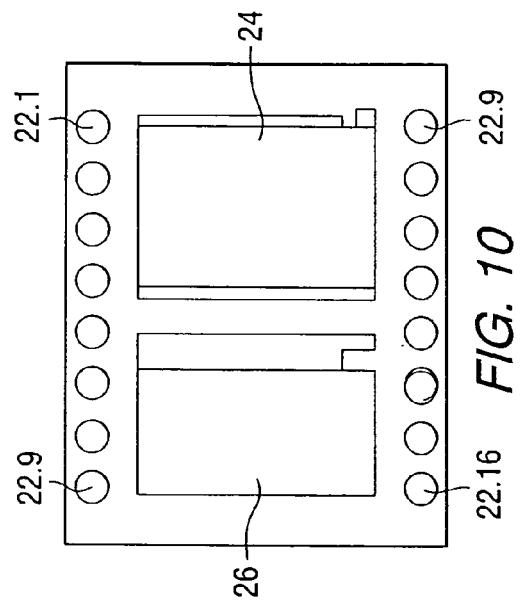
FIG. 10 is a bottom view corresponding to FIG. 9.

The leadframe 10 of FIG. 1 holds a controller integrated circuit on one side and high and low side mosfets on the other side to provide a multichip module with logic and power devices. The leadframe 10 has source pads 24, 26 for receiving source studs and inner leads 34, 36 for receiving the gate studs. The inner source pads 24, 26 are integral with outer source leads 124, 126 respectively, for connecting the sources of the mosfets to the outer leads. The inner gate leads 34, 36 are integral with outer gate leads 134, 136, respectively. The outer leads receive ball contacts that may be attached directly to a printed circuit board. The outer gate leads 134, 136 are connected to the controller chip through wire bonds on the other side of the lead frame.

Figure 21:
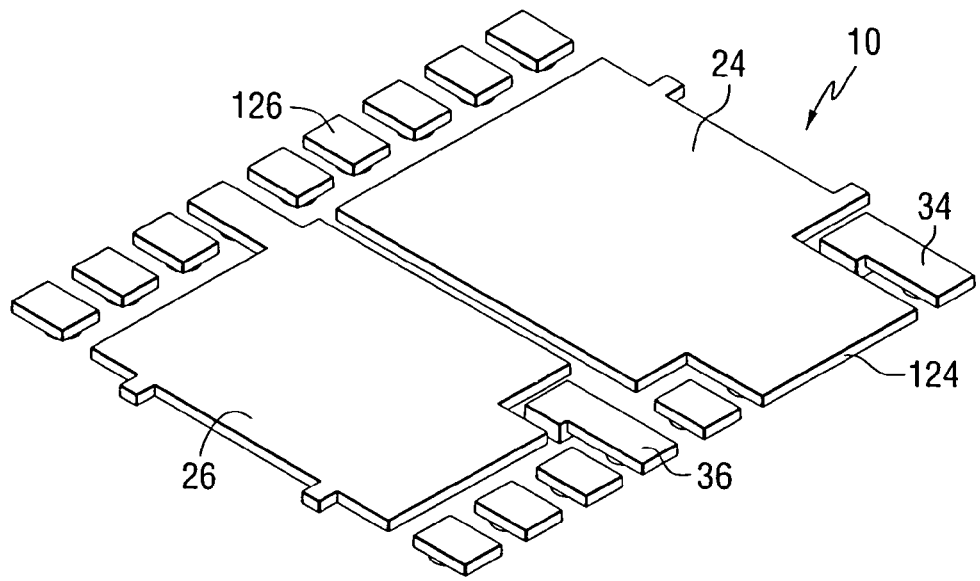
FIG. 21 is a top perspective view of a half etched leadframe showing a die pad where the integrated circuit is attached.
Figure 22:
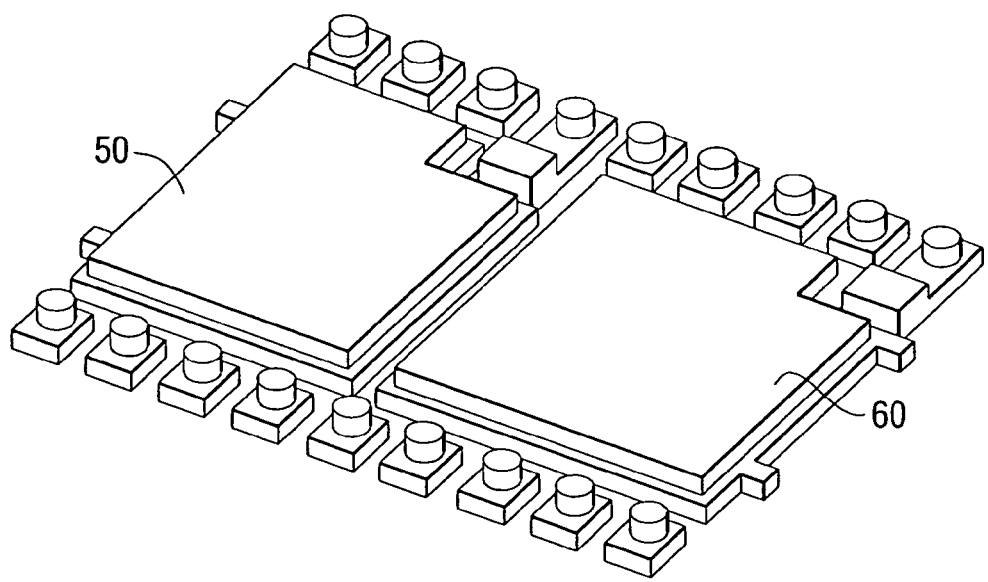
FIG. 22 is a bottom perspective view of the bottom of the leadframe showing raised lands for the source, gate and outer leads.
Figure 26A:
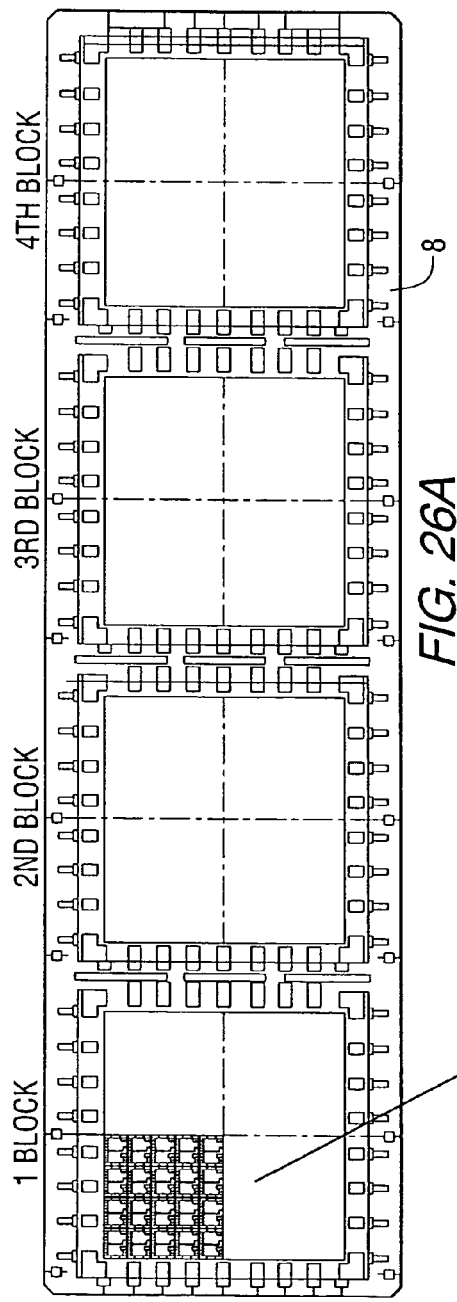
FIG. 26A is a plan view of a block of dies on a tape.
Figure 26C:
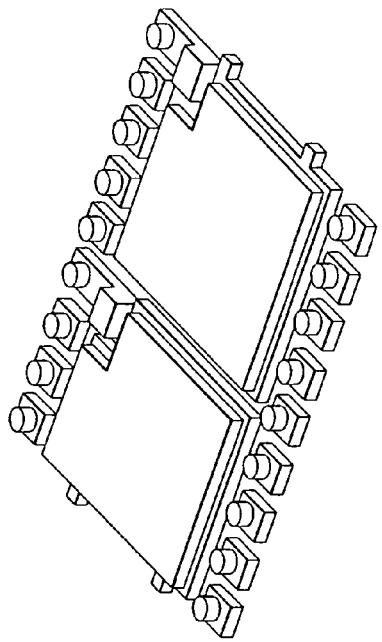
FIG. 26C is a perspective view of the lower side of the leadframe that receives the power mosfets.
Figure 26B:
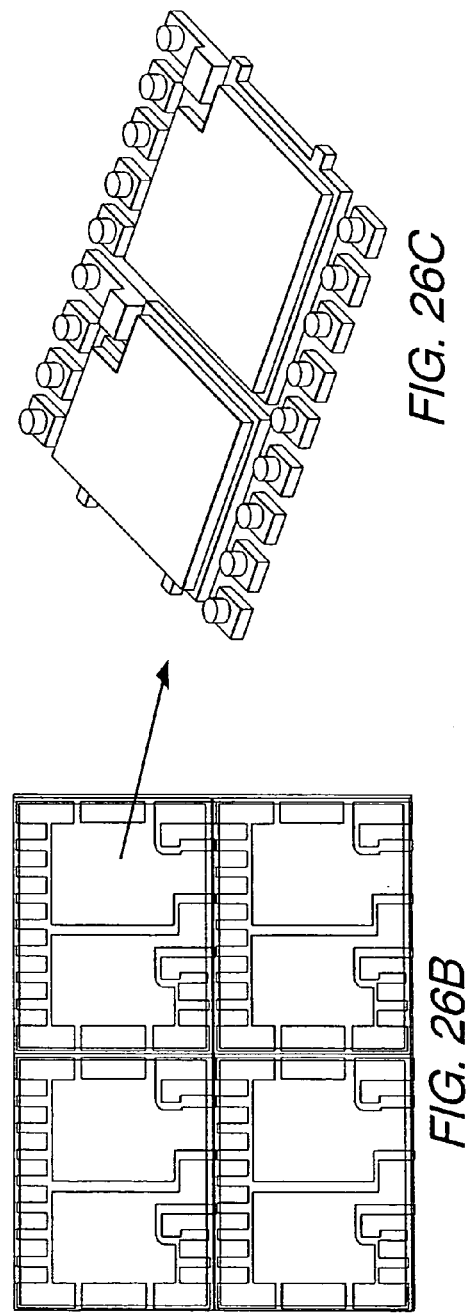
FIG. 26B is an enlarged view of one of the blocks.

The leadframe is initially half etched to prepare one surface of the leadframe to receive multiple flip chip mounted mosfets. With reference to FIGS. 21, 22, half etching defines a pattern for mounting on one lead frame a wire bonded integrated circuit and multiple flip chip mosfets. That process is performed and the half etched lead frame is placed on the adhesive side of a tape 8. The tape that holds the leadframe is typically a high temperature resistant material, such as polyimide. The integrated circuit 14 is attached to the die pad on the leadframe and the leadframe is over molded with insulating resin or plastic 18. During molding and encapsulation, the half etched portion is filled with the mold compound. The over molded leadframe is shown in FIG. 23. Before flip chip mounting, the tape 8 is removed to expose the previously defined flip chip mounting pattern including, for example, a ball attach land pattern and the gate and source pads. See FIG. 24. The mosfets are flip chip attached to the bottom of the lead frame as shown in FIG. 25.

Figure 2:
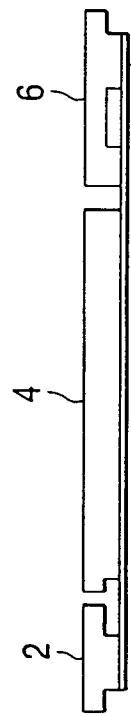
FIG. 2 is a cross sectional view of the leadframe of FIG. 1.
Figure 3:
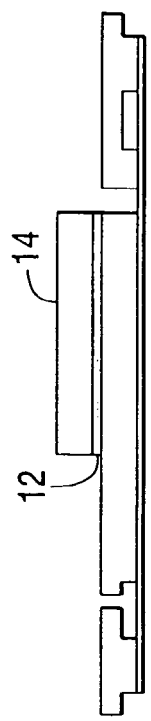
FIG. 3 is a further cross sectional view showing an integrated circuit attached to the upper surface of the die pad of the leadframe.
Figure 4:
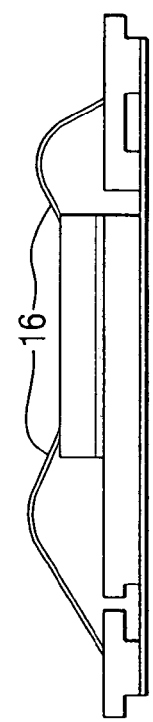
FIG. 4 shows the wire bonding of the integrated circuit.
Figure 6:
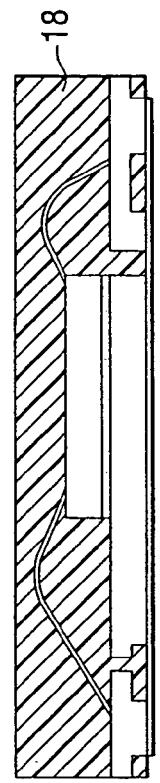
FIG. 6 shows a cross section of the molded leadframe of FIG. 5

The invention is made by following the process steps shown in FIGS. 1–12. In FIG. 1 a single leadframe 10 is shown with its half etched mosfet side facing the viewer. The leadframe 10 is carried on a tape 8 that has a number of leadframes. Each half etched leadframe has outer leads along opposite sides 2, 6. There are eight outer leads on each side. The leadframe has mosfet source contact inner pads 24, 26 and gate inner leads 34, 36. As shown in FIG. 2, the mosfet side of the leadframe is on the tape 8 and the controller side of the leadframe is exposed.

A layer of conventional die adhesive 12 is applied to the surface of a central die pad 4. The controller integrated circuit die 14 is then placed on the layer of adhesive 12 by a pick-and-place machine (not shown). Next, wire bonds 16 are applied to the die 14. The wire bonds are very thin conductors made of gold or aluminum or are alloys of conductive, ductile materials. Each wire bond connects a contact pad on the die 14 to an outer upper lead of the lead frame 10.

Following wire bonding, the die 14 is molded over with plastic insulating material. See FIGS. 5, 6 and 26A–C. The tape 8 has blocks of die arranged in sets of four leadframes per block. Blocks of leadframes 10 are placed in a molding machine (not shown) where molten plastic is transfer or injection molded to cover the dies 14. Multiple integrated circuit controller dies are simultaneously molded and a typical molding operation may mold hundreds of dies at one time. The molded dies 14 are removed from the mold and the molded package 10 is flipped onto its opposite side. Tape 8 is removed to expose the lower side of the leadframe. Mosfets typically have copper studs. A solder paste is screen printed or dispensed for copper studded mosfets that are flip chip attached to leadframes. The solder paste is screen printed onto the lower side of the leadframe. It is patterned to define the solder connections for the mosfets to the leadframe and the solder ball connections for the outer leads.

Figure 12:
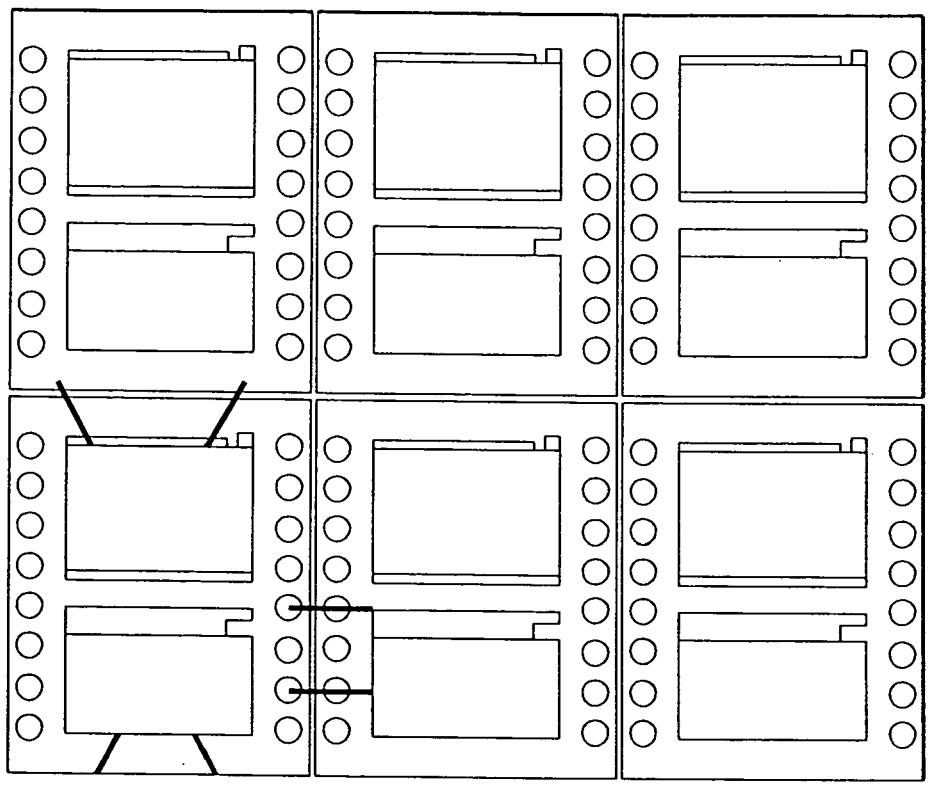
FIG. 12 shows a multiple chips undergoing test.
Figure 11:
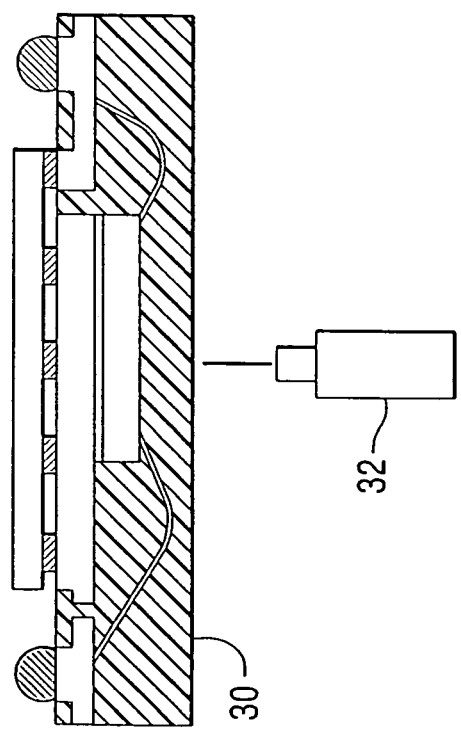
FIG. 11 shows the marking step.

In particular, a solder paste is dispensed or screen printed on ball land patterns and on the source and gate pads of the flip chip. Then the solder is ball attached. After that the solder ball and the flip chipped MOSFETs are reflowed simultaneously. See FIGS. 9, 10. High and low side mosfets 50, 60 are bump attached to the mosfet pads 24, 26. Bumps or studs previously formed on the surfaces of the mosfets are soldered to the lead 24, 26, 34, 36 so that the sources and the gates of the mosfets are connected to the outer leads of the leadframe. As shown in FIG. 12 six multichip modules are formed on joined leadframes. The modules are marked with laser or ink indicia at a marking station 32 to indicate their components. Thereafter the modules are separated from each other, placed in electrostatic protective packages, and shipped to a customer.

Figure 13:
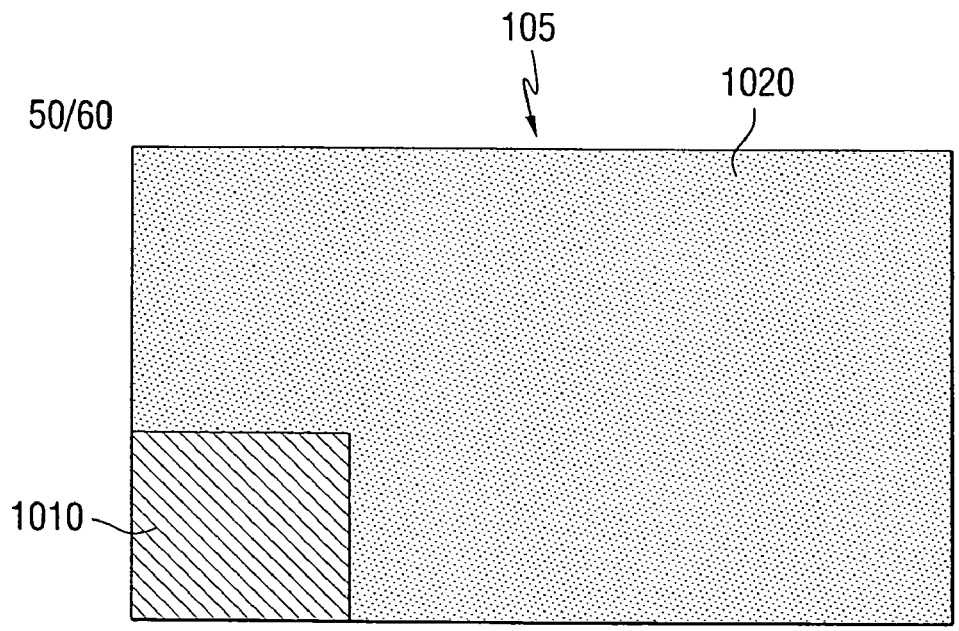
FIG. 13 shows a plan layout of source and gate contact pads.
Figure 14:
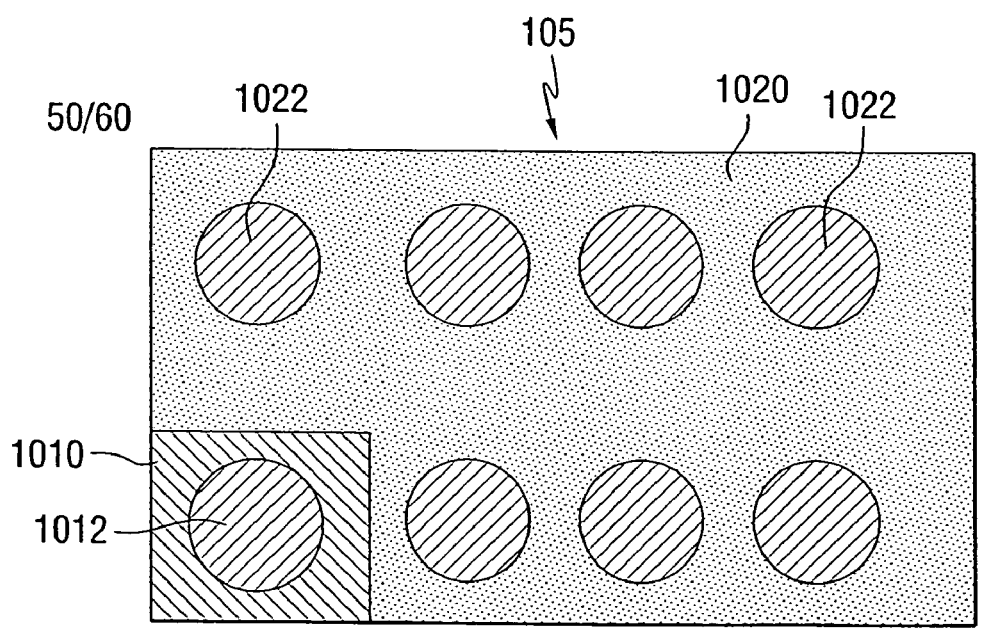
FIG. 14 shows a stud layout for the source and gate contact pads.
Figure 15:
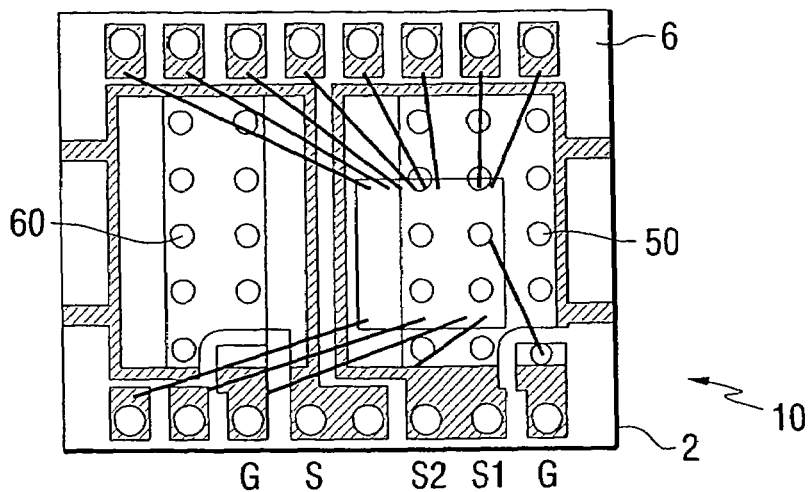
FIG. 15 shows a wire bonding diagram for the multichip module with the mosfets shown in phantom.
Figure 16:
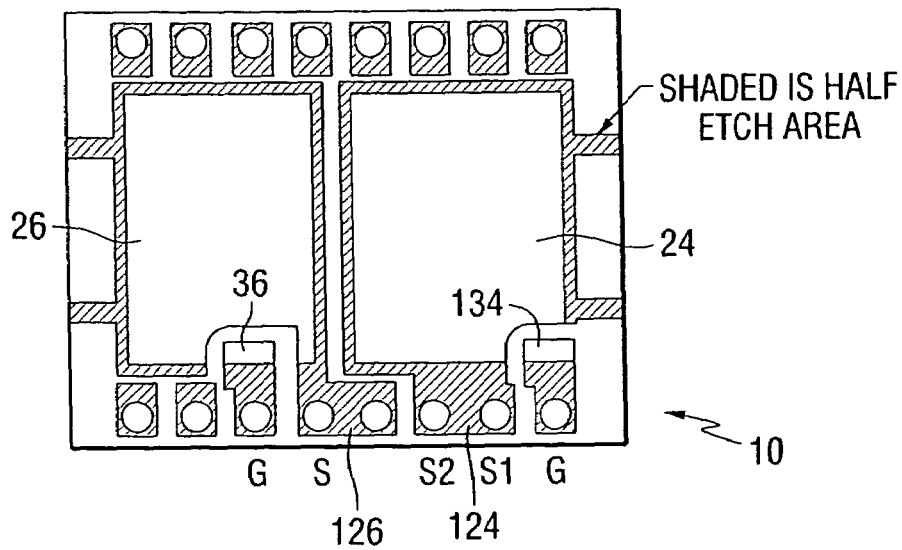
FIG. 16 is an enlarged view of the half etched areas.

The mosfets 50, 60 have conventional source and gate contacts as shown in FIG. 13. The control gate contact 1010 occupies one corner of the entire face 105 of the device. The source contact 1020 occupies the rest of the face 105. Gate contact bumps 1012 and source contact bumps 1022 are added as shown in FIG. 14. A single bump 1012 is conventionally placed in the middle of the control gate contact 1010, and multiple bumps 1022 are conventionally placed in an array across the entire source contact 1020.

The contact bumps or studs are conventional features used on semiconductor devices for tape automated bonding (TAB). That process originated in the 1960s at General Electric Research Laboratories. However, the invention uses the stud or bump process for attaching the mosfets to the lower side of a wire bonded leadframe.

In order to form the bumps or studs, a series of barrier and seed layers of metal are deposited over the surface of the wafer. A layer of photoresist is deposited over these barrier and seed layers. A photomask is used to pattern the locations over each of the pads that will be bumped. An etching process exposes the pads, and the open resist hole defines the shape and height of the bump. The bump or stud, which is typically copper or gold, is then electroplated over the pad and the deposited barrier metals. Once the plating is complete, a series of etching steps are used to remove the photoresist and the barrier metal layers that are covering the rest of the die. The bump or stud protects the underlying materials from being etched. In addition to gold and copper, other stud or bump materials include tin-lead and layered combinations of conductors. The gate has one bump contact and the other bumps contact the source.

Ball contacts are applied to the outer leads on the lower surface of the lead frame. The ball contacts are also conventional and well known to those skilled in the art who understand how to make ball grid array packages. Typical ball contacts comprise balls of solder that are attached to the lower outer leads of the lead frame. Selected leads on the upper side are wire bonded to the controller integrated circuit.

Figure 17:
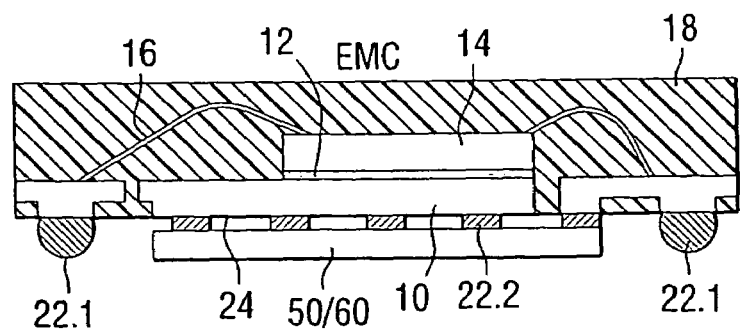
FIG. 17 is an enlarged view of the packaged multichip module.

The assembled multichip module 30 is shown in FIG. 17. The upper surface of the central die pad has a die attach epoxy 12 that holds the integrated circuit controller 14 to the central die pad. Wire bonds 16 extend from contact areas on the integrated circuit to outer leads 2.6 of the lead frame 10. The wire is typically gold wire. The integrated circuit is encapsulated in an insulating plastic resin 18. On the opposite, lower side of the central die pad, the mosfets 50, 60 are bump or stud attached to the half etched regions of the lead frame. The bumps or studs 22.2 are preferably copper stud bumps. The half etched leadframe provides connections to the outer leads for the mosfets. The drains 37 of the mosfets and the ball contacts 22.1 on the outer leads are soldered to a printed circuit board.

Figure 19:
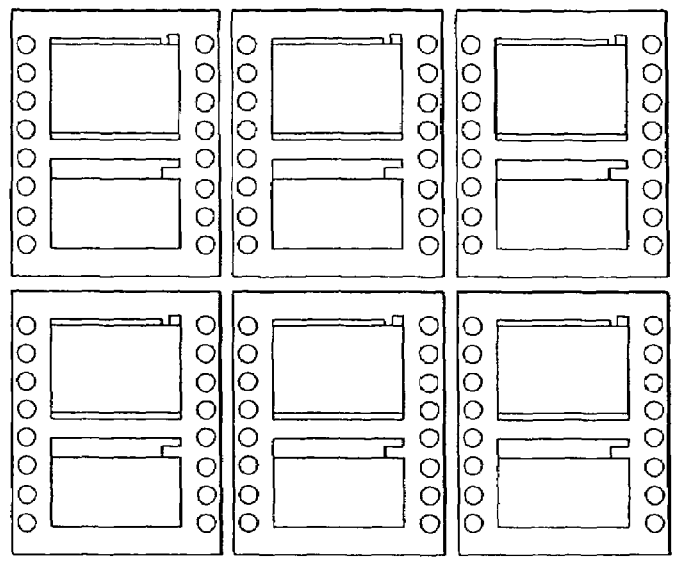
Figure 18:
FIG. 18, 19 shows a separation step.
Figure 18:
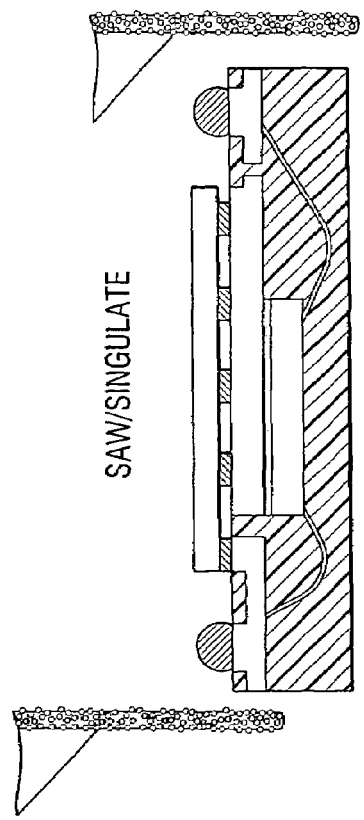
Figure 20:
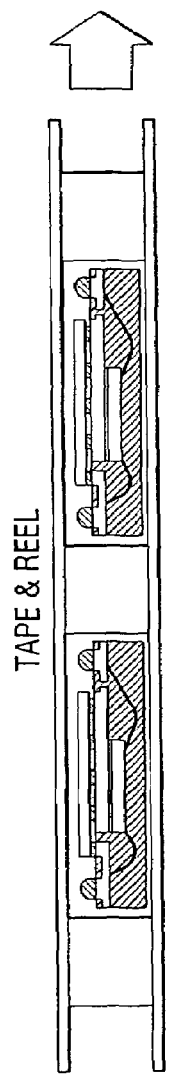
FIG. 20 shows a package and ship step.

The adjacent, overmolded modules are separated from each other by a saw as shown in FIGS. 18, 19. Saw separation is a well known step. After separation the individual multichip modules 30 are placed on a reel of adhesive tape and shipped to a customer for assembly onto a printed circuit board. See FIG. 20.

The multichip module of the invention uses a standard package footprint that enables customers to readily incorporate the invention into existing fabrication and test equipment. The invention improves overall system performance by closely packaging the power and controller die. It thus provides a shorter interconnection length between the power and controller dies. The invention also increases interconnection density and reduces the space needed on printed circuit board for the dies that comprise a system. The closer packaging made possible with the invention reduces power consumption and permits designers to use smaller drivers because less power is not lost over the shorter interconnects made possible with the invention.

The total system cost of packaging is reduced and there is an overall faster time to market with more dense packages. Because the invention relies upon known wire bonding, overmolding and flip chip techniques, no additional tooling is required to implement the invention. Flip chip on leadframe improves signal integrity and lowers cost.

Those skilled in the art understand that the invention is not limited to the embodiment discussed above. The invention may have one or more integrated circuit dies on the top side and one or more mosfets on the bottom side. Nor is the leadframe limited to the configuration shown above. For example, the invention could also be implemented with other types of leadframes, such as those used with quad flat packs.

Having thus shown and described an example of the invention, those skilled in the art understand that further modifications, additions and deletions of elements and steps may be made to the invention without departing from the spirit and scope of the following claims.

The invention claimed is:

1. A multi flip chip module comprising:
   one leadframe having one die pad with upper and lower surfaces and a plurality of outer leads surrounding the die pad;
   an integrated circuit mounted on the upper surface of the die pad and having contact areas for receiving bond wires;
   bond wires extending from the contact areas on the integrated circuit to the outer leads of the leadframe;
   one or more power mosfet semiconductor devices flip chip mounted on the lower surface of the leadframe; and
   a molded resin encapsulating the integrated circuit and leaving exposed at least one surface of the power mosfet semiconductor devices.

2. The multichip module of claim 1 wherein the mosfets have source bump contacts extending from the surfaces of the mosfets to the die pad and one or more gate bump contacts for each mosfet extending to a corresponding outer lead.

3. The multichip module of claim 1 wherein the lead frame has leadless contacts comprising ball contacts extending from the outer leads for establishing an electrical connection to the contact areas of the integrated circuit via the bond wires and for providing surface mounts for connecting the semiconductor device to a surface of an electrical component board.

4. The multichip module of claim 1 wherein exposed surface(s) of the power mosfets are surface mountable on an electrical component board.

5. A multichip module having one lead frame with one central die pad and peripheral outer leads, an integrated circuit on one side of the die pad, wire bonds for connecting the integrated circuit to outer leads, one or more mosfets having their respective source and gate bumps connected to the other side of the central die pad, said central die pad patterned to provide connections to the outer leads from the source and gate bump connections.

6. The multichip module of claim 5 wherein the integrated circuit is encapsulated in an insulating resin.

7. A multi flip chip module comprising:
   a leadframe having a die pad with upper and lower surfaces and a plurality of leads surrounding the die pad;
   an integrated circuit mounted on the upper surface of the die pad and having contact areas for receiving connections to the outer leads;

a first type of electrical and mechanical connection for connecting terminals of the integrated circuit to the outer leads of the leadframe;

one or more power mosfet semiconductor devices mounted on the lower surface of the leadframe; and a second type of electrical and mechanical connection, different from the first type, for connecting the power mosfet(s) to the leadframe; and a molded resin encapsulating the integrated circuit and leaving exposed at least one surface of the power mosfet semiconductor devices.

8. The multi flip chip module of claim 7 wherein the second type of electrical connection is a bond wire connection.

9. The multi flip chip module of claim 7 wherein the second type of electrical connection is a ball array or stud array connection.

10. A multi flip chip module comprising:

a leadframe having a die pad with upper and lower surfaces and a plurality of outer leads surrounding the die pad;

an integrated circuit mounted on the upper surface of the die pad and having contact areas for receiving connections to the outer leads;

wire bonds connecting contact areas of the integrated circuit to the leads of the leadframe;

one or more power mosfet semiconductor devices mounted on the lower surface of the leadframe; and an electrical and mechanical connection different from wire bonds for connecting the power mosfet(s) to the leadframe; and a molded resin encapsulating the integrated circuit and leaving exposed at least one surface of the power mosfet semiconductor devices.

11. The multi flip chip module of claim 10 wherein the electrical and mechanical connection different from wire bonds for connecting the power mosfet(s) to the leadframe comprises a ball grid array or a stud grid array.

12. A multi flip chip module comprising:

a leadframe having a die pad with upper and lower surfaces and a plurality of outer leads surrounding the die pad;

an integrated circuit mounted on the upper surface of the die pad and having contact areas for receiving connections to the outer leads;

an electrical and mechanical connection different from ball grid or stud grid array for connecting contact areas of the integrated circuit to the leads of the leadframe;

one or more power mosfet semiconductor devices mounted on the lower surface of the leadframe; and ball grid or stud grid arrays for connecting the power mosfet(s) to the leadframe; and a molded resin encapsulating the integrated circuit and leaving exposed at least one surface of the power mosfet semiconductor devices.

13. The multi flip chip module of claim 12 wherein the electrical and mechanical connection different from ball grid array or stud grid array is a wire bond connection.

* * * * *